(12) United States Patent
Liao et al.

(10) Patent No.: US 9,479,115 B2
(45) Date of Patent: Oct. 25, 2016

(54) DUPLEXER AND CABLE MODEM USING A DUPLEXER

(71) Applicant: HON HAI PRECISION INDUSTRY CO., LTD., New Taipei (TW)

(72) Inventors: Chun-Fa Liao, New Taipei (TW); Kuang-Wei Cheng, New Taipei (TW)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 167 days.

(21) Appl. No.: 14/257,147

(22) Filed: Apr. 21, 2014

(65) Prior Publication Data

US 2015/0036554 A1 Feb. 5, 2015

(30) Foreign Application Priority Data

Aug. 5, 2013 (TW) .............................. 102127925 A

(51) Int. Cl.
*H03D 1/04* (2006.01)

(52) U.S. Cl.
CPC ...................................... *H03D 1/04* (2013.01)

(58) Field of Classification Search
CPC . H04L 5/14; H04N 21/4263; H04N 21/6168
See application file for complete search history.

(56) References Cited

U.S. PATENT DOCUMENTS

| 2004/0246687 | A1* | 12/2004 | Abe .......................... G06F 1/18 361/752 |
| 2006/0026659 | A1* | 2/2006 | McMullin ........ H04N 21/25883 725/111 |
| 2007/0218850 | A1 | 9/2007 | Pan |
| 2008/0130680 | A1* | 6/2008 | Choi ................... H04L 12/2801 370/468 |
| 2009/0165070 | A1* | 6/2009 | McMullin ................ H04B 1/10 725/125 |
| 2010/0117693 | A1 | 5/2010 | Lorg et al. |
| 2011/0230152 | A1 | 9/2011 | Tsai |

FOREIGN PATENT DOCUMENTS

| CN | 101098549 A | 1/2008 |
| TW | 200618626 | 10/2007 |
| TW | 200924280 | 6/2009 |
| TW | 201106611 A1 | 2/2011 |
| TW | 201145817 A1 | 12/2011 |

* cited by examiner

*Primary Examiner* — Siming Liu
(74) *Attorney, Agent, or Firm* — Zhigang Ma

(57) ABSTRACT

A duplexer, applying in a cable modem, comprises a first mixer, a band-pass filter and a second mixer, in order to filter MoCA interference signal of downstream signals, a series of steps are carried out, which comprising up-conversion, filtering lower and lower frequency. The duplexer use a synthesizer to provide the local oscillator source to the first mixer and the second mixer according to the channel scan signals and use a channel scan controller to provide the channel scan signal of the local oscillator source to the synthesizer.

15 Claims, 1 Drawing Sheet

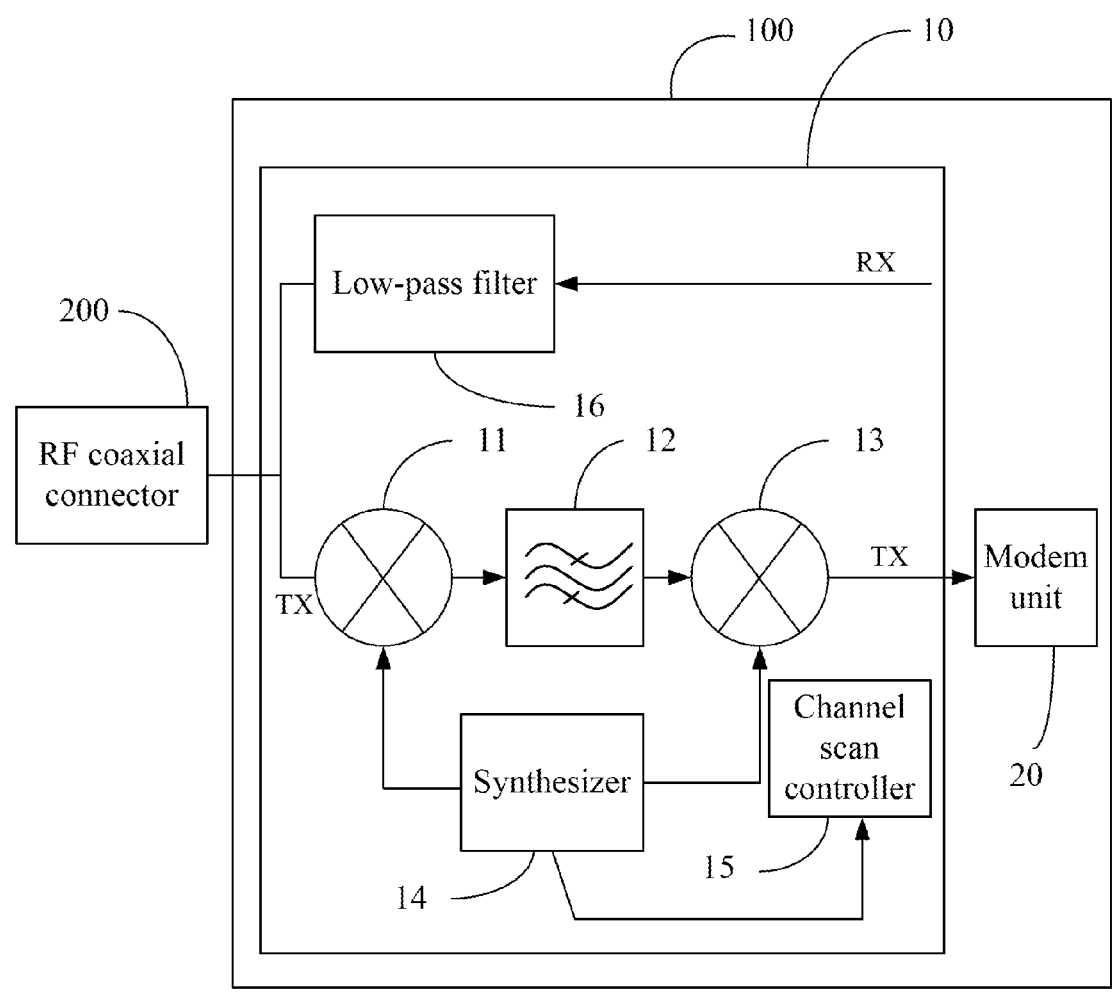

DUPLEXER AND CABLE MODEM USING A DUPLEXER

FIELD

The disclosure relates to cable modem, and particularly to a duplexer and cable modem of using the duplexer.

BACKGROUND

Transmission rates of cable modems based on the DOCSIS3.0 standard has been substantial increased. Furthermore, downstream data transmission band of downstream path has extended from 860 MHz to a 1002 MH. The transmission band is close to Multimedia over Coax Alliance (MoCA), often causing downstream data to be interfered by the MoCA signal. A traditional method of filtering interference signals from the MoCA signal is applied in a LC filter. However, because the frequency band of the downstream path is too close to the frequency band of the MoCA signal and because the filter ability of the LC filter is limited, this results in the interference signal from the MoCA signal not being effectively filtered. Special high-frequency portions of the cable modem downstream data (near 1002 MHz) are still susceptible to interfering MoCA signals, which may lead to an increased data transmission error rate, and may reduces the transmission rate and receiver sensitivity of the cable modem.

BRIEF DESCRIPTION OF THE DRAWINGS

Many aspects of the present embodiments can be better understood with reference to the tracking drawing. The components in the drawing are not necessarily drawn to scale, the emphasis instead being placed upon clearly illustrating the principles of the present embodiments. Moreover, in the drawing, all the views are schematic, and like reference numerals designate corresponding parts throughout the several views.

A schematic diagram of one embodiment of a cable modem comprises a duplexer as disclosed.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean "at least one."

The word "module" as used hereinafter, refers to logic embodied in hardware or firmware, or to a collection of software instructions, written in a programming language, such as, for example, JAVA, C, or assembly. One or more software instructions in the modules may be embedded in firmware such as in an EPROM. It will be appreciated that modules may comprise connected logic units, such as gates and flip-flops, and may comprise programmable units, such as programmable gate arrays or processors. The modules described herein may be implemented as either software and/or hardware modules and may be stored in any type of computer-readable medium or other computer storage device.

FIG. 1 is a schematic diagram of one embodiment of a cable modem 100 comprising a duplexer 10 as disclosed. In one embodiment, the duplexer 10 can include a downstream data channel TX and a upstream data channel RX. The downstream data channel TX includes a first mixer 11, a band-pass filter 12, a second mixer 13, a synthesizer 14 and a channel scan controller 15. In one embodiment, the cable modem 100 is based on DOCSIS3.0 standard, and a downstream data transmission band of downstream data channel TX can reach 1002 MHz.

The first mixer 11 up-converts a downstream signal to obtain a first mixed signal and transmits the first mixed signal to the band-pass filter 12. In one embodiment, a frequency of the downstream signal is defined as $F_1+n*F_0$. A frequency of the first mixed signal is $F_1+F_2+(m+n)*F_0$, $F_1$, $F_2$ and $F_0$ are all preset frequency values, where each of m and n is a constant.

The band-pass filter 12 is connected between the first mixer 11 and the second mixer 13. The band-pass filter 12 is used for receiving the first mixed signal and filtering interference signals from the mixed signal to obtain a second mixed signal and transmitting the second mixed signal to the second mixer 13. The second mixed signal is the mixed signal of having filtered the interference signals. In one embodiment, the interference signals of the mixed signal includes a MoCA signal located from 1125 MHz to 1525 MHz. The band-pass filter 12 is a surface acoustic wave (SAW) filter and a center frequency of the band-pass filter 12 is preset as $F_1+F_2+(m+n)*F_0$.

The second mixer 13 receives the second mixed signal and reduces a frequency of the second mixed signal to the frequency of the downstream signal to obtain a third mixed signal and transmits the third mixed signal to a modem unit 20 of the cable modem 100 to demodulate. In one embodiment, the third mixed signal is the mixed signal that the frequency of the second mixed signal has reduced to the frequency of the downstream signal, the modem unit 20 demodulates the third mixed signal and transmits to respective external device (FIG. 1 is not showed).

The synthesizer 14 is connected to the first mixer 11 and the second mixer 13, and provides a local oscillator source for the first mixer 11 and the second mixer 13 as needed.

The first mixer 11 up-converts the frequency (e.g. $F_1+n*F_0$) of the downstream signal according to the local oscillator source. The second mixer 13 reduces the frequency of the second mixed signal to frequency of the downstream signal according to the local oscillator source. In one embodiment, the frequency of the downstream signal is $F_1+n*F_0$, the frequency of the local oscillator source is $F_2+m*F_0$, $F_2$ is a preset value, m valued in a preset range parameter. In order to avoid being close to frequency of the MoCA signal, the frequency of the local oscillator source needs to be preset a rational value.

The channel scan controller 15 is connected to the synthesizer 14 and provides channel scan signal to the synthesizer 14, and makes the synthesizer 14 provide the local oscillator source to the first mixer 11 and the second mixer 13 according to the channel scan signal. In one embodiment, the channel scan signal is the m of the local oscillator source $F_2+m*F_0$, the range of the channel scan signal is from 0 to 148.

If the frequency of the downstream signal is $F_1+n*F_0$, m is 148−n, the synthesizer 14 transmits the frequency of the local oscillator source $F_2+(148-n)*F_0$ to the first mixer 11 and the second mixer 13, then the frequency of the third mixed signal is $F_1+F_2+148 F_0$ and filtered by the band-pass filter 12.

Furthermore, the cable modem 100 also can be connected to a RF coaxial connector 200. The upstream data channel RX includes a low-pass filter (LPF). The LPF is used for filtering the upstream signal received by the upstream data channel RX, then the filtered signal by the LPF is transmitted by the RF coaxial connector 200.

The foregoing disclosure of the various embodiments has been presented for purposes of illustration and description. It is not intended to be exhaustive or to limit the present disclosure to the precise forms disclosed. Many variations and modifications of the embodiments described herein will be apparent to one of ordinary skill in the art in the light of the above disclosure. The scope of the present disclosure is to be defined only by the claims appended hereto and their equivalents.

What is claimed is:

1. A duplexer, applying in a cable modem, comprising:
   a first mixer, up-converting a downstream signal to obtain a first mixed signal;
   a band-pass filter, connected to the first mixer, receiving the first mixed signal and filtering interference signals from the first mixed signal to obtain a second mixed signal;
   a second mixer, connected to the band-pass filter, receiving the second mixed signal and down-converting the second mixed signal to a frequency of the downstream signal to obtain a third mixed signal, and transmitting the third mixed signal to a modem unit of the cable modem to demodulate;
   a synthesizer, connected to the first mixer and the second mixer, providing a local oscillator source for the first mixer and the second mixer needed; and
   a channel scan controller, wherein the channel scan controller is connected to the synthesizer and provides channel scan signals to the synthesizer, and the synthesizer provides the local oscillator source to the first mixer and the second mixer according to the channel scan signals;
   wherein a frequency of the downstream signal is defined as $F1+n*F0$ and a frequency of the local oscillator source is defined as $F2+m*F0$; F2 is a preset value, n is a constant, m valued from 0 to 148 signifies the channel scan signal, m is 148−n, and the synthesizer transmits the frequency of the local oscillator source $F2+(148-n)*F0$ to the first mixer and the second mixer.

2. The duplexer of claim 1, wherein the band-pass filter is a surface acoustic wave filter.

3. The duplexer of claim 1, wherein the interference signals comprise Multimedia over Coax Alliance signals located from 1125 MHz to 1525 MHz.

4. The duplexer of claim 1, further comprising a low-pass filter, wherein the low-pass filter filters upstream signal received by the duplexer.

5. The duplexer of claim 1, wherein the modem unit is connected to a RF coaxial connector, the low-pass filter transmits the filtered upstream signal through the RF coaxial connector.

6. A cable modem, comprising a duplexer, wherein the duplexer comprising:
   a first mixer, up-converting a downstream signal to obtain a first mixed signal;
   a band-pass filter, connected to the first mixer, receiving the first mixed signal and filtering interference signals of the first mixed signal to obtain a second mixed signal;
   a second mixer, connected to the band-pass filter, receiving the second mixed signal and reducing frequency of the second mixed signal to a frequency of the downstream signal to obtain a third mixed signal, and transmitting the third mixed signal to a modem unit of the cable modem to demodulate;
   a synthesizer, connected to the first mixer and the second mixer, providing a local oscillator source for the first mixer and the second mixer needed; and
   a channel scan controller, wherein the channel scan controller is connected to the synthesizer and provides channel scan signals to the synthesizer, and the synthesizer provides the local oscillator source to the first mixer and the second mixer according to the channel scan signals;
   wherein a frequency of the downstream signal is defined as $F1+n*F0$ and a frequency of the local oscillator source is defined as $F2+m*F0$; F2 is a preset value, n is a constant, m valued from 0 to 148 signifies the channel scan signal, m is 148−n, and the synthesizer transmits the frequency of the local oscillator source $F2+(148-n)*F0$ to the first mixer and the second mixer.

7. The cable modem of claim 6, wherein the band-pass filter is a surface acoustic wave filter.

8. The cable modem of claim 6, wherein the interference signals comprise Multimedia over Coax Alliance signals located from 1125 MHz to 1525 MHz.

9. The cable modem of claim 6, further comprising a low-pass filter, wherein the low-pass filter filters upstream signal received by the duplexer.

10. The cable modem of claim 6, wherein the modem unit is connected to a RF coaxial connector, the low-pass filter transmits the filtered upstream signal through the RF coaxial connector.

11. The cable modem of claim 6, wherein the cable modem is based on DOCSIS3.0.

12. A duplexer, applying in a cable modem, comprising:
    a first mixer, up-converting a downstream signal to obtain a first mixed signal;
    a band-pass filter, connected to the first mixer, receiving the first mixed signal and filtering interference signals from the first mixed signal to obtain a second mixed signal;
    a second mixer, connected to the band-pass filter, receiving the second mixed signal and down-converting the second mixed signal to a frequency of the downstream signal to obtain a third mixed signal, and transmitting the third mixed signal to a modem unit of the cable modem to demodulate;
    a synthesizer, connected to the first mixer and the second mixer, providing a local oscillator source for the first mixer and the second mixer needed; and
    a channel scan controller, wherein the channel scan controller is connected to the synthesizer and provides channel scan signals to the synthesizer, and the synthesizer provides the local oscillator source to the first mixer and the second mixer according to the channel scan signals.

13. The duplexer of claim 12, wherein the channel scan signals are determined according to a frequency of the downstream signal.

14. The duplexer of claim 13, wherein a centered frequency of the band-pass filter is sum of a frequency of the local oscillator source and that of the downstream signal.

15. The duplexer of claim 14, wherein the frequency of the downstream signal is defined as $F1+n*F0$ and a frequency of the local oscillator source is defined as $F2+m*F0$; F2 is a preset value, n is a constant, m valued from 0 to 148 signifies the channel scan signal, m is 148−n, and the synthesizer transmits the frequency of the local oscillator source $F2+(148-n)*F0$ to the first mixer and the second mixer, the centered frequency of the band-pass filter is $F1+F2+148F0$.

\* \* \* \* \*